United States Patent [19]
Huang

[11] Patent Number: 5,780,337
[45] Date of Patent: Jul. 14, 1998

[54] METHOD OF FABRICATING A BIT LINE OF A DYNAMIC RANDOM ACCESS MEMORY

[75] Inventor: Hsiu-Wen Huang, Kaoshiung, Taiwan

[73] Assignee: United Microelectronics Corporation, Taipei, Taiwan

[21] Appl. No.: 752,427

[22] Filed: Nov. 19, 1996

[30] Foreign Application Priority Data

Sep. 23, 1996 [TW] Taiwan ................................ 85111514

[51] Int. Cl.$^6$ ........................................... H01L 21/8242
[52] U.S. Cl. ........................................... 438/253; 438/254
[58] Field of Search ................................ 438/253, 254

[56] References Cited

U.S. PATENT DOCUMENTS 5,248,628  9/1993  Okabe et al. ........................ 437/52
5,539,231  7/1996  Suganaga et al. .................... 257/306

*Primary Examiner*—Jey Tsai
*Attorney, Agent, or Firm*—Rabin, Champagne, & Lynt, P.C.

[57] ABSTRACT

A method of forming a bit line of a dynamic random access memory. An insulating layer is used to cover the source/drain region in a substrate. A trench is formed in the insulating layer above the source/drain region. Then, a portion of the insulating layer inside the trench is removed to form an opening which exposes the source/drain region. A conductor is used to fill the trench and the opening so as to form a bit line and a metal plug, respectively.

8 Claims, 4 Drawing Sheets

5,780,337

1

METHOD OF FABRICATING A BIT LINE OF A DYNAMIC RANDOM ACCESS MEMORY

BACKGROUND OF THE INVENTION

1. Field of the Invention

The invention relates in general to the fabrication of an integrated circuit (IC), and more particularly to a method for reducing the parasitic capacitance of a dynamic random access memory (DRAM).

2. Description of the Related Art

DRAM has accounted for most of the IC products on the market today. Simplicity in design and relative ease in taking advantage of new technological advances have made the DRAM a natural vehicle for technology development.

The basic building block of any memory circuit is a memory cell in which a single bit of information is stored. The DRAM has the simplest cell structure, consisting of a single MOSFET or FET transistor, each containing two source/drain regions, and a single capacitor. The transistors are formed in rows and columns. A bit line is connected to one of the two source/drain regions of all transistors in a row.

A method of fabricating a conventional bit line of a DRAM is illustrated in FIG. 1, and includes the following steps: Field oxide layers 12a, 12b are formed in a memory cell region A of a silicon substrate 10. A first polysilicon layer is then formed so as to provide gates 14a, 14b and wiring lines 14c, 14d. Source/drain regions 16a, 16b, 16c in the memory cell region A and a source/drain region 17 in a peripheral circuit region B of the substrate 10 are formed simultaneously. A second polysilicon layer is formed so as to provide lower electrodes 18a, 18b. Dielectric layers 19a, 19b are then formed on the lower electrodes 18a, 18b. Next, a third polysilicon layer is formed in order to provide upper electrodes 20a, 20b. In this arrangement, the lower electrode 18a, the dielectric layer 19a and the upper electrode 20a together are to serve as a first capacitor for a first memory cell; the lower electrode 18b, the dielectric layer 19b and the upper electrode 20b together are to serve as a second capacitor for a second memory cell. A first insulating layer 22 is then formed and etched to provide an opening which exposes the source/drain region 16b. The opening is filled with a fourth polysilicon layer 24, whose upper surface is above the upper surface of the first insulating layer 22. A silicide 26 is formed on an upper surface of the fourth polysilicon layer 24 to improve the latter's conductivity. Herein, an upper portion of the fourth polysilicon layer 24, which is above the upper surface of the first insulating layer 22, and the silicide 26, together are to serve as the bit line. Moreover, after a second insulating layer 28 is formed, the second insulating layer 28 and the first insulating layer 22 are both etched so that a conductive plug 30 and a wiring line 32, respectively, can be formed in the peripheral circuit region B.

Since the bit line is composed of the upper portion of the fourth polysilicon layer 24 and the silicide 26, the bit line formed in accordance with the conventional method, is exposed. Therefore, as the size of the device is reduced, which correspondingly reduces the distance between two bit lines, an undesirable parasitic capacitance is likely to form. Morover, the formation of the parasitic capacitance is a barrier to the formation of a high density device.

SUMMARY OF THE INVENTION

It is therefore an object of the invention to provide a method of forming a bit line of a DRAM that overcomes the

2 above-mentioned problem. The method includes the following steps: In each column, an adjacent pair of memory cells is formed in a substrate with a common source/drain region. An insulating layer is then formed over the substrate. In the insulating layer, a trench is formed above the common source/drain region. A portion of the insulating layer at the bottom surface of the trench is etched to form a contact window. Moreover, the trench and the first contact window are filled with a conductor, wherein the conductor in the trench serves as a bit line, and the conductor in the contact window serves as a plug.

BRIEF DESCRIPTION OF THE DRAWINGS

Other objects, features, and advantages of the invention will become apparent from the following detailed description of the preferred but non-limiting embodiments, with reference to the accompanying drawings in which.

DESCRIPTION OF THE PREFERRED EMBODIMENT

Figure 1:
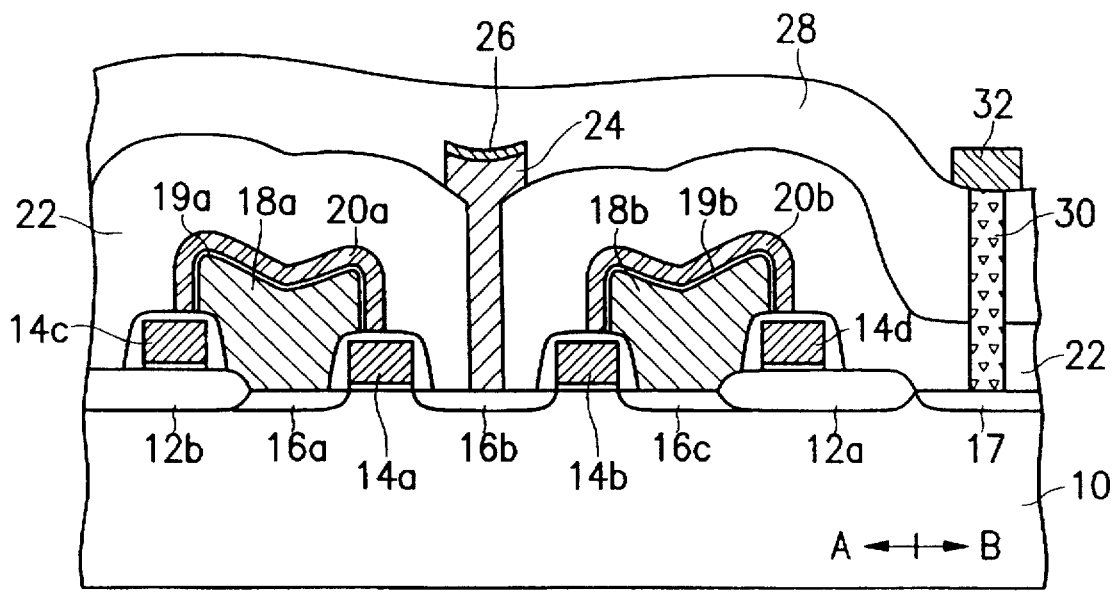
FIG. 1 is a cross-sectional view showing conventional bit lines in a DRAM.
Figure 2A:
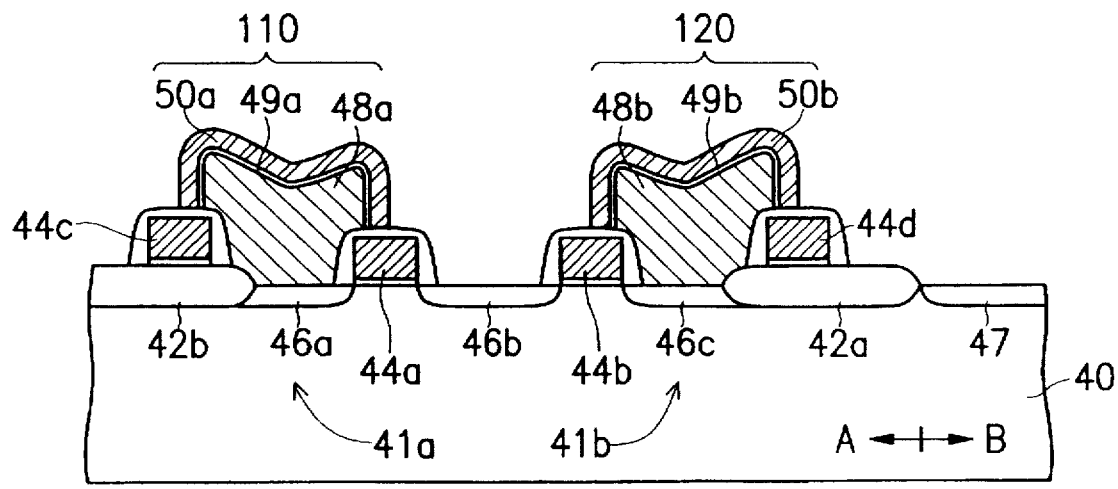
FIGS. 2A through 2E are cross-sectional views showing a process of fabricating a bit line in a DRAM according to a preferred embodiment of the invention.

Referring first to FIG. 2A, field oxide layers 42a, 42b are formed in a memory cell region A of a semiconductor substrate 40, such as a silicon substrate. Then, a first memory cell 41a and a second memory cell 41b are formed in a column in the substrate 40. The first memory cell 41a includes a gate 44a, source/drain regions 46a, 46b, a wiring line 44c, and a capacitor 110, wherein the capacitor 110 includes a lower electrode 48a, a dielectric film 49a, and an upper electrode 50a. The second memory cell 41b includes a gate 44b, source/drain regions 46b, 46c, a wiring line 44d, and a capacitor 120, wherein the capacitor 120 includes a lower electrode 48b, a dielectric film 49b, and an upper electrode 50b. Thus, the source/drain region 46b is common to the first memory cell 41a and the second memory cell 41b. Moreover, a source/drain region 47 in the peripheral circuit region B and the source/drain regions 46a, 46b, 46c in the memory cell region A are formed simultaneously. Such memory cells are formed in rows and columns as in the conventional device.

Figure 2B:
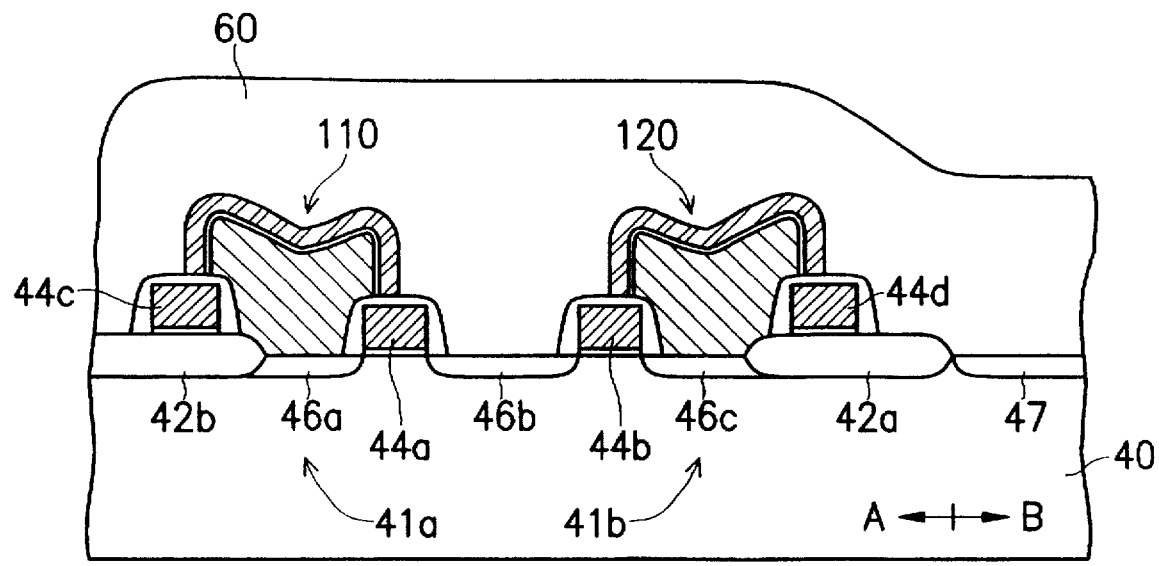
Figure 2C:
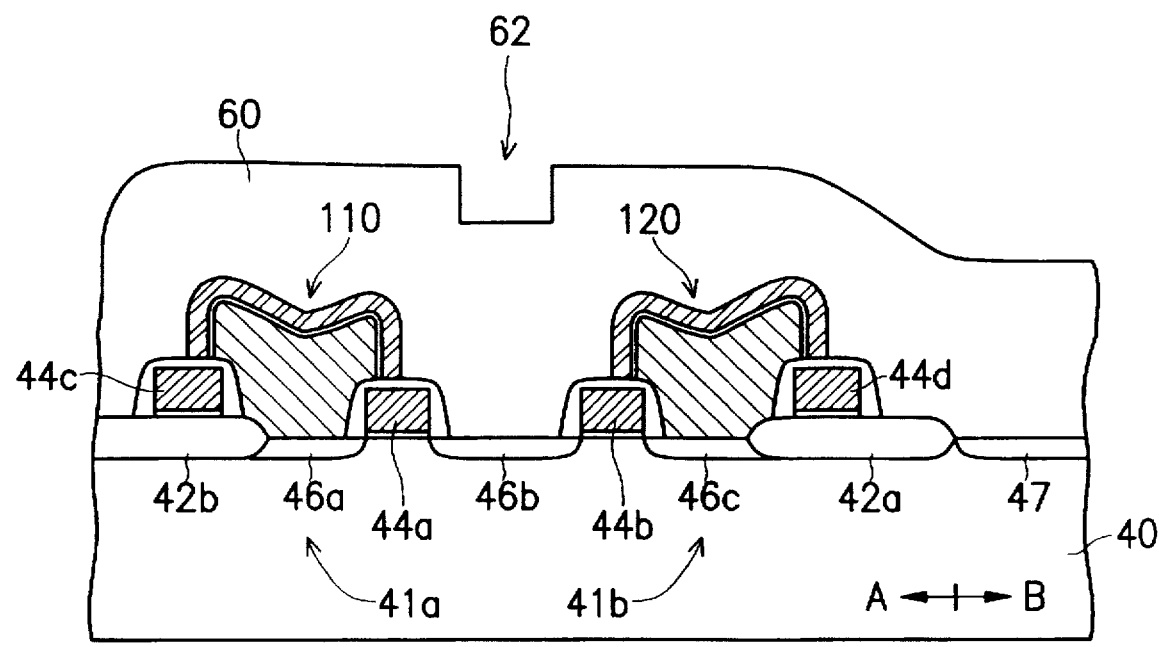

Referring next to FIG. 2B, an insulating layer 60, such as an oxide layer with a thickness of about 600 nm to 1000 nm, is formed on the substrate 40. Then, referring to FIG. 2C, the insulating layer 60 is etched so as to form a trench 62 which exposes the location of a bit line to be formed above the common source/drain region 46b. The trench 62 is formed, for example, using an anisotropic etching technique, so as to have a depth of about 200 nm to 300 nm, and a width of about 300 nm to 600 nm.

Figure 2D:
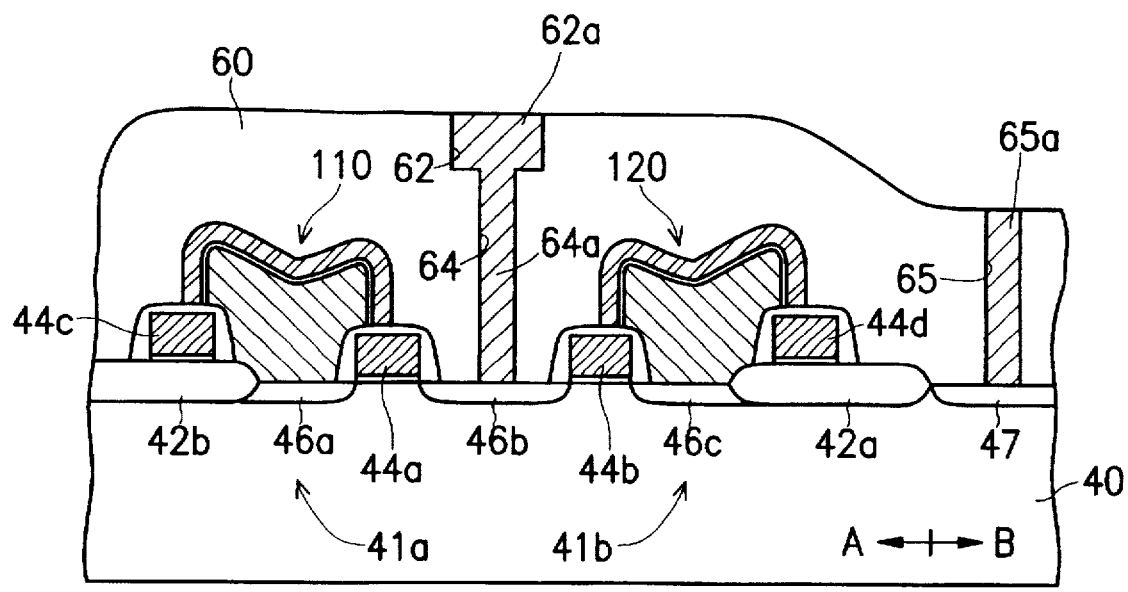

Referring to FIG. 2D, a portion of the insulating layer 60 at the bottom surface of the trench 62 is etched to form a contact window 64, which exposes the common source/drain region 46b. Simultaneously, a contact window 65 which exposes the source/drain region 47 is formed in the peripheral circuit region B. Next, a conductive material, such as tungsten, is used to fill the trench 62, the contact window 64, and the contact window 65, using chemical vapor deposition (CVD), and etched back respectively to form a bit line 62a, and a metal plug 64a in the memory cell region A and a metal plug 65a in the peripheral circuit region B. In this manner, the bit line is connected to respective common drain/source regions in each row.

Figure 2E:
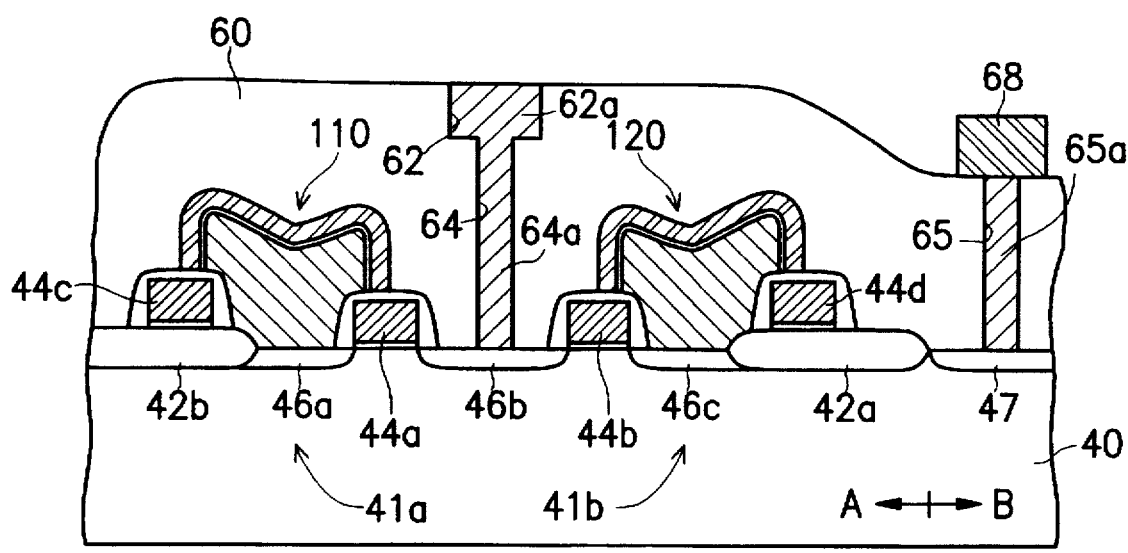

Referring to FIG. 2E, a wiring line 68 is formed over the metal plug 65a in the peripheral circuit region B, for example, using sputtering to form an aluminum line.

Figure 3:
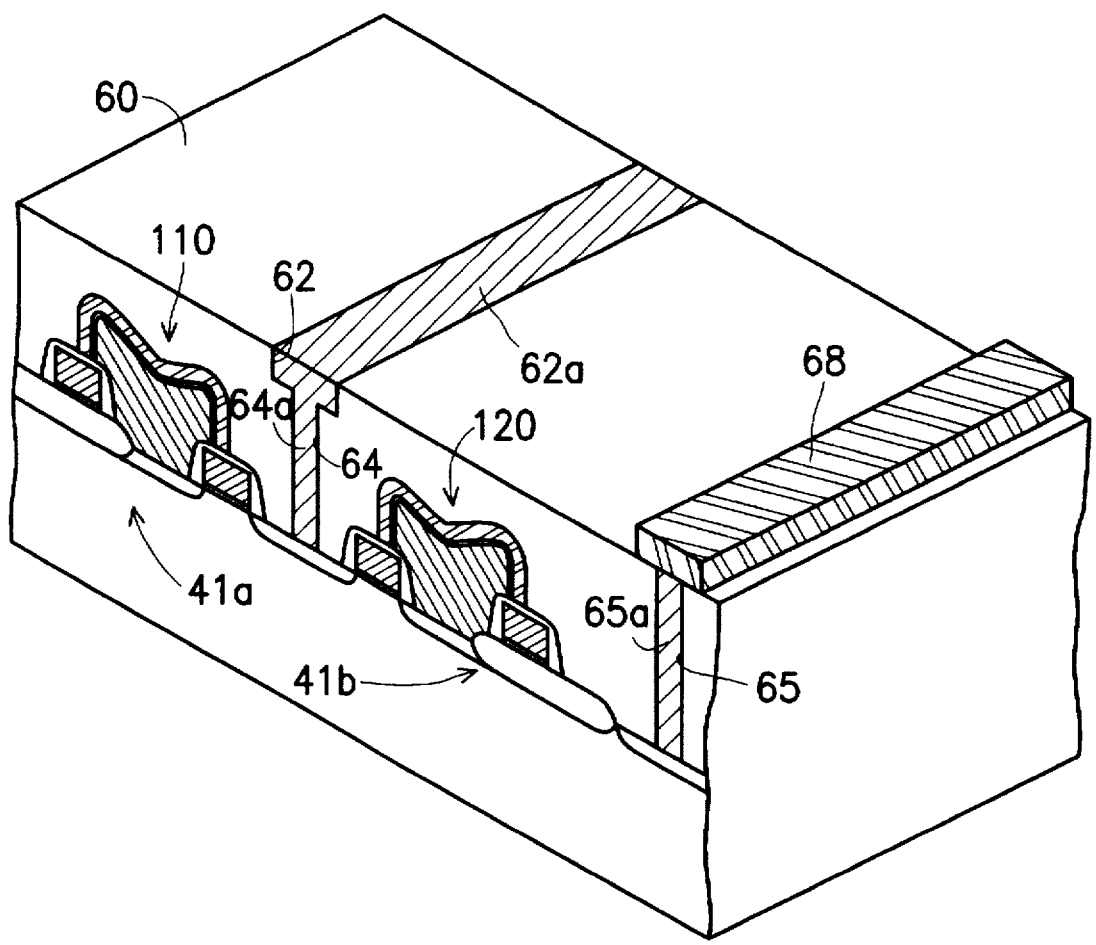
FIG. 3 is a three-dimensional cross-sectional view showing the bit line structure in a DRAM formed according to the process illustrated in FIGS. 2A–2E.

As is illustrated three-dimensionally in FIG. 3, the bit line 62a is buried in the insulating layer 60. Since the bit line 62a is buried in the insulating layer 60, the distance along a column between two bit lines can be reduced without creating parasitic capacitance. As a result, the size of the device can be reduced to meet the requirement of high integration.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of forming a bit line of a dynamic random access memory, comprising:

providing a substrate having a memory cell region;

forming a first memory cell and a second memory cell in the memory cell region, wherein the first memory cell and the second memory cell have a common source/drain region;

forming a periphery circuit region on the substrate;

forming an insulating layer over the substrate;

forming a trench, having a bottom surface, in the insulating layer above the common source/drain region;

removing a portion of the insulating layer at the bottom surface of the trench to form a first contact window, wherein the first contact window exposes the common source/drain region;

forming a second contact window in the periphery circuit region simultaneously with forming the first contact window in the memory cell region; and filling the trench and the first contact window with a conductor, wherein the conductor in the trench serves as a bit line, and the conductor in the contact window serves as a plug.

2. A method according to claim 1, wherein the insulating layer includes oxide.

3. A method according to claim 1, wherein the insulating layer has a thickness of about 600 nm to 1000 nm.

4. A method according to claim 1, wherein the trench has a depth of about 200 nm to 300 nm.

5. A method according to claim 1, wherein the trench has a width of about 300 nm to 600 nm.

6. A method according to claim 1, wherein the conductor includes tungsten.

7. A method according to claim 1, wherein said filling the trench and the first contact window includes sputtering.

8. A method according to claim 1, further comprising filling the second contact window with a conductor.

* * * * *